(12) United States Patent
Shen

(10) Patent No.: US 7,525,192 B2
(45) Date of Patent: Apr. 28, 2009

(54) PRINTED CIRCUIT BOARD WITH QUARTZ CRYSTAL OSCILLATOR

(75) Inventor: Ling-Ling Shen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 110 days.

(21) Appl. No.: 11/309,215

(22) Filed: Jul. 13, 2006

(65) Prior Publication Data

US 2007/0114638 A1 May 24, 2007

(30) Foreign Application Priority Data

Nov. 23, 2005 (CN) .......................... 2005 1 010768

(51) Int. Cl.
*H01L 23/34* (2006.01)
*H01L 23/053* (2006.01)

(52) U.S. Cl. ............... 257/724; 257/701; 257/E23.011; 257/659; 331/68

(58) Field of Classification Search ............... 257/724, 257/701, 698, 659; 331/68, 187
See application file for complete search history.

(56) References Cited

U.S. PATENT DOCUMENTS

| 3,909,726 | A | * | 9/1975 | Dobrovolny et al. | ...... 455/150.1 |
| 5,172,077 | A | * | 12/1992 | Funada | ........................ 331/67 |
| 5,229,640 | A |  | 7/1993 | Pak |  |
| 5,267,379 | A |  | 12/1993 | Pak |  |
| 5,654,676 | A | * | 8/1997 | Avanic et al. | ................... 331/67 |
| 6,229,404 | B1 | * | 5/2001 | Hatanaka | ...................... 331/68 |
| 6,512,680 | B2 | * | 1/2003 | Harada et al. | ................. 361/777 |
| 2002/0036546 | A1 | * | 3/2002 | Hatanaka et al. | ............... 331/68 |
| 2004/0036165 | A1 | * | 2/2004 | Ammar | ...................... 257/723 |
| 2005/0133909 | A1 | * | 6/2005 | Franca-Neto | ................ 257/724 |
| 2005/0230812 | A1 | * | 10/2005 | Przadka | ........................ 257/698 |

\* cited by examiner

*Primary Examiner*—Nitin Parekh
(74) *Attorney, Agent, or Firm*—Wei Te Chung

(57) ABSTRACT

A printed circuit board with a quartz crystal oscillator includes a mounting area for receiving the quartz crystal oscillator, two first vias, and two second vias. A copper foil is arranged on the mounting area. Pins of the quartz crystal oscillator are inserted into the first vias. The second vias are connected to a ground layer of the PCB and communicate with the copper foil, for transmitting noise of the quartz crystal oscillator to the ground layer of the PCB.

6 Claims, 3 Drawing Sheets

PRINTED CIRCUIT BOARD WITH QUARTZ CRYSTAL OSCILLATOR

FIELD OF THE INVENTION

The present invention relates to a printed circuit board (PCB), and more particularly to a quartz crystal oscillator layout for a PCB which readily sends noise generated by the oscillator to ground.

DESCRIPTION OF RELATED ART

Quartz crystal oscillators control timing and operation of logic circuitry. The use of quartz crystal oscillators is widespread in consumer and industrial electronic products. A personal computer system, for example, may use quartz crystal oscillators in the processing unit as well as video graphics adapters, and in peripheral devices such as printers, modems, and networking equipment.

Referring to FIG. 3, a quartz crystal oscillator layout for a PCB 200 includes a rectangular mounting area 10, four vias 20, 21, 22, and 23. The mounting area 10 is used for mounting a quartz crystal oscillator. The vias 22 and 23 are connected to a ground layer of the PCB 200. When the quartz crystal oscillator is mounted on the mounting area 10, pins of the quartz crystal oscillator are respectively inserted into the vias 20 and 21. The quartz crystal oscillator is mounted on the mounting area 10 through a wire, and two ends of the wire are respectively soldered to the vias 22 and 23.

The quartz crystal oscillator transmits clock signals to corresponding layers of the PCB 200 through the vias 20 and 21. Noise of the quartz crystal oscillator generating from high levels to low levels should be transmitted from a metal enclosure of the quartz crystal oscillator to the ground layer of the PCB 200 through the wire. However, contact area between the metal enclosure and the wire is small, thereby limiting an amount of noise sent to ground, which interferes with the transmitting characteristics of the PCB 200.

What is needed is a quartz crystal oscillator layout for a PCB which more readily sends noise generated by the oscillator to ground which can improve transmitting characteristics of the PCB.

SUMMARY OF THE INVENTION

An exemplary quartz crystal oscillator layout for a printed circuit board (PCB) in accordance with a preferred embodiment includes a mounting area for receiving the quartz crystal oscillator, two first vias, and two second vias. A copper foil is arranged on the mounting area. Pins of the quartz crystal oscillator are inserted into the first vias. The second vias are connected to a ground layer of the PCB and communicate with the copper foil, for transmitting noise of the quartz crystal oscillator to the ground layer of the PCB.

Other advantages and novel features will become more apparent from the following detailed description, in which:

DETAILED DESCRIPTION OF THE INVENTION

Figure 1:
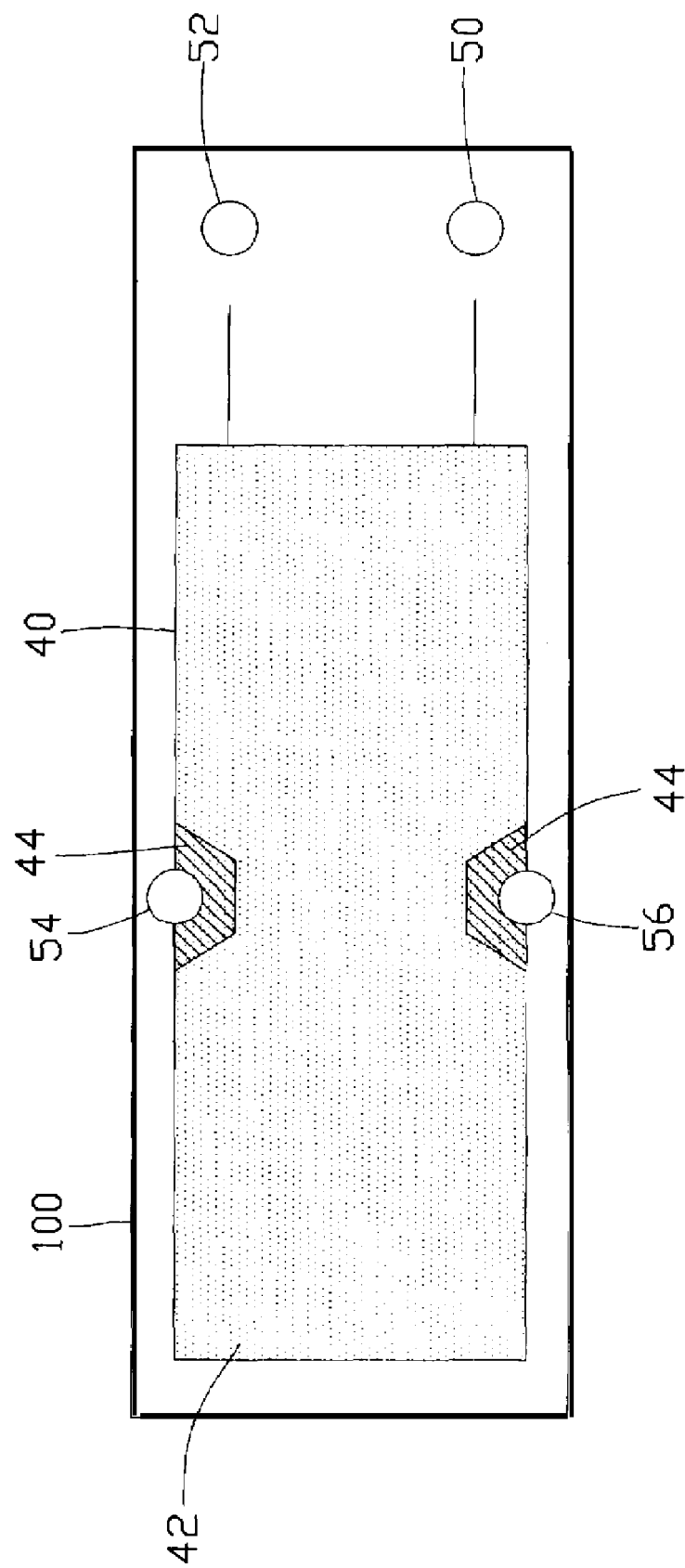
FIG. 1 is a quartz crystal oscillator layout for a PCB in accordance with a preferred embodiment of the present invention.

Referring to FIG. 1, a layout of a circuit part like a printed circuit board (PCB) 100 for a noise-generating electronic component like a quartz crystal oscillator in accordance with a preferred embodiment of the present invention includes a rectangular mounting area 40, two vias 50 and 52 defined beside the mounting area 40, and two vias 54 and 56 respectively defined in middle portions of two opposite long edges of the mounting area 40, communicating with bordering areas of the PCB 100 adjacent the long edges. An electrically conductive layer like a copper foil 42 is attached to the mounting area 40. The mounting area 40 is positioned on a signal layer of the PCB, for a quartz crystal oscillator to be mounted thereon. Solder masks 44 are respectively attached on the copper foil 42 about the vias 54 and 56 to prevent an electrical connection being formed between the copper foil 42 and solder portions at the vias 54 and 56. The vias 54 and 56 are connected to a ground layer of the PCB.

Figure 2:
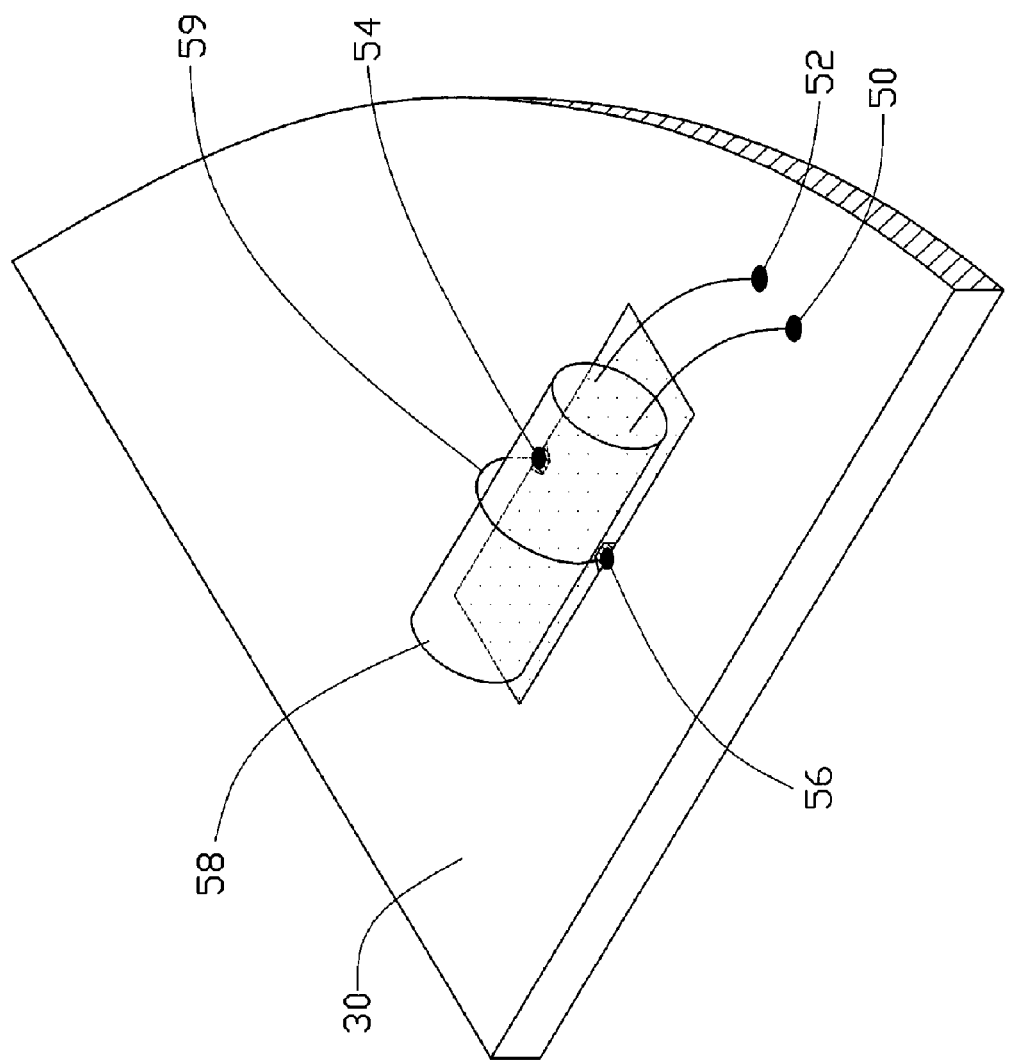
FIG. 2 is a perspective view of FIG. 1 with a quartz crystal oscillator mounted thereon.
Figure 3:
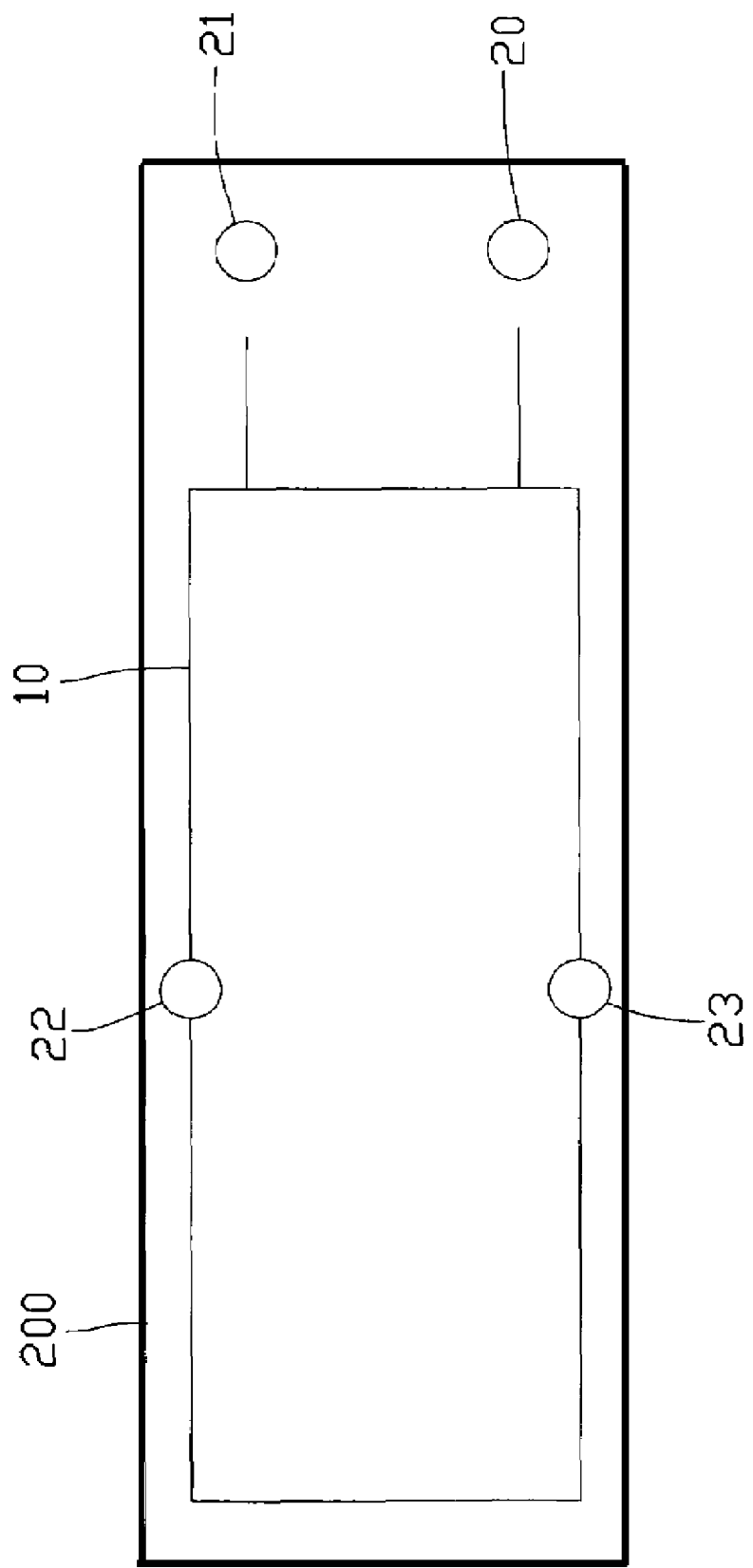
FIG. 3 is a conventional quartz crystal oscillator layout for a PCB.

Referring to FIG. 2, in application, pins of a quartz crystal oscillator 58 are respectively inserted into the vias 50 and 52. The quartz crystal oscillator 58 is placed on the mounting area 40. Then a wire 59 is passed over the oscillator 58 and each of its ends are respectively soldered to the vias 54 and 56, thus securing the quartz crystal oscillator 58 to the mounting area 40. A bottom portion of a metal enclosure of the quartz crystal oscillator 58 contacts the copper foil 42, thus noise of the quartz crystal oscillator 58 are easily and quickly transmitted to the ground layer of the PCB through the vias 54 and 56.

In the embodiment, when the quartz crystal oscillator 58 is secured to the mounting area 40, contact between the copper foil 42 and the metal enclosure of the quartz crystal oscillator 58 allows the noise of the quartz crystal oscillator 58 to be transmitted to the ground layer of the PCB via a shortest route. The layout of the quartz crystal oscillator 58 improves the stability of the PCB 100. Furthermore, the solder masks 44 prevent an electrical connection from being formed between the copper foil 42 and the soldered ends of the wire 59 at the vias 54 and 56.

It is believed that the present embodiment and it's advantages will be understood from the foregoing description, and it will be apparent that various changes may be made thereto without departing from the spirit and scope of the embodiment or sacrificing all of its material advantages, the example hereinbefore described merely being preferred or exemplary embodiment.

What is claimed is:

1. A printed circuit board (PCB) with a quartz crystal oscillator comprising:

a substrate;

a mounting area defined on an upper surface of the substrate for receiving the quartz crystal oscillator, a copper foil being arranged on the mounting area, and contacting the outside of the quartz crystal oscillator;

two first vias, pins of the quartz crystal oscillator being inserted into the first vias; respectively two second vias connected to a ground layer of the PCB and communicating with the copper foil, for transmitting noise at the outside of the quartz crystal oscillator to the ground layer of the PCB wherein a solder mask is attached on the copper foil around each of the second vias for preventing an electrical connection between the copper foil, and a securing wire is connected to the second vias, wherein the securing wire passes over the quartz crystal oscillator, and two ends of the wire are respectively soldered to the second vias.

2. The PCB as claimed in claim 1, wherein the copper foil is positioned on a signal layer of the PCB.

3. The PCB as claimed in claim 1, wherein the first vias are defined beside the mounting area, and the second vias are respectively defined along opposite long edges of the mounting area.

4. The PCB as claimed in claim 1, wherein the copper foil is sized larger than a projective area of the quartz crystal oscillator on the mounting area.

5. An assembly comprising:
- a circuit part comprising preset circuits therein for performing a predetermined function, said circuit part defining a mounting area thereon spaced from said circuits, and comprising at least one via formed beside said mounting area being electrically connected to said circuits;
- a noise-generating component installable to said circuit part by placing said component on said mounting area of said circuit part, said component electrically connected with said at least one via for signal communication with said circuits;
- an electrically conductive layer placed between said mounting area of said circuit part and said component, and electrically connected between said circuits of said circuit part and said component in order to ground noise generated by said component through said electrically conductive layer and said circuits of said circuit part
- and wherein the assembly further comprises another two vias formed in said circuit part adjacent said mounting area and being electrically connected between said electrically conductive layer and said circuits of said circuit part, said another vias connected with said component by means of a wire physically extending between said another vias and said component so as to ground said noise through said wire.

6. The assembly as claimed in claim 5, wherein said electrically conductive layer is sized larger than a projective area of said component on said mounting area.

* * * * *